United States Patent [19]

Endoh et al.

[11] 4,187,478

[45] Feb. 5, 1980

[54] NOISE REDUCTION SYSTEM HAVING SPECIFIC ENCODER CIRCUITRY

[75] Inventors: Kenjiro Endoh; Motokazu Ohkawa, both of Yokohama; Kazuo Kitagawa, Kawasaki; Hideshi Kira, Yokohama, all of Japan

[73] Assignee: Tokyo Shibaura Electric Co., Ltd., Kawasaki, Japan

[21] Appl. No.: 844,436

[22] Filed: Oct. 21, 1977

[30] Foreign Application Priority Data

Oct. 21, 1976 [JP] Japan ................... 51-126564

[51] Int. Cl.$^2$ ............................................. H04B 1/64
[52] U.S. Cl. .................................. 333/14; 307/264; 325/62; 328/168; 330/126; 330/295
[58] Field of Search ....................... 333/14; 307/264; 328/168, 169, 172; 325/62, 65; 179/1 P, 1 VL; 330/126, 295

[56] References Cited

U.S. PATENT DOCUMENTS

| 3,795,876 | 3/1974 | Takahashi et al. ............ 333/14 |
| 3,815,039 | 6/1974 | Fujisawa et al. ............ 333/14 X |

Primary Examiner—Paul L. Gensler
Attorney, Agent, or Firm—Oblon, Fisher, Spivak, McClelland & Maier

[57] ABSTRACT

A noise reduction system is provided with an encoder for compressing the dynamic range of an audio input signal in accordance with the amplitude of the input signal and recording the compressed one into a tape-recorder, and a decoder for expanding the dynamic range of a reproduced audio signal from the tape-recorder to the original one in accordance with the amplitude of the reproduced audio signal. The encoder includes a first controlled amplifier circuit in which, when the input audio signal is low- and middle-levels, sufficient emphasis is made to the signal at high-frequencies, and when it is in high-level, the emphasis quantity at high-frequencies is restrictive. The decoder includes a second controlled amplifier circuit having a transfer function related to the character of the first controlled amplifier circuit substantially in inverse-function manner. The first controlled amplifier includes a variable response amplifier having a first resistor connected at one end to an input terminal, a current amplifier with variable gain amplifying current extracted from the other end of the first resistor, a series circuit having a second resistor and a capacitor and connected at one end to the input terminal, and means for adding an output current of the other end of the series circuit with an output current of the current amplifier and means for converting the summed current into voltage directed to an output terminal.

8 Claims, 16 Drawing Figures

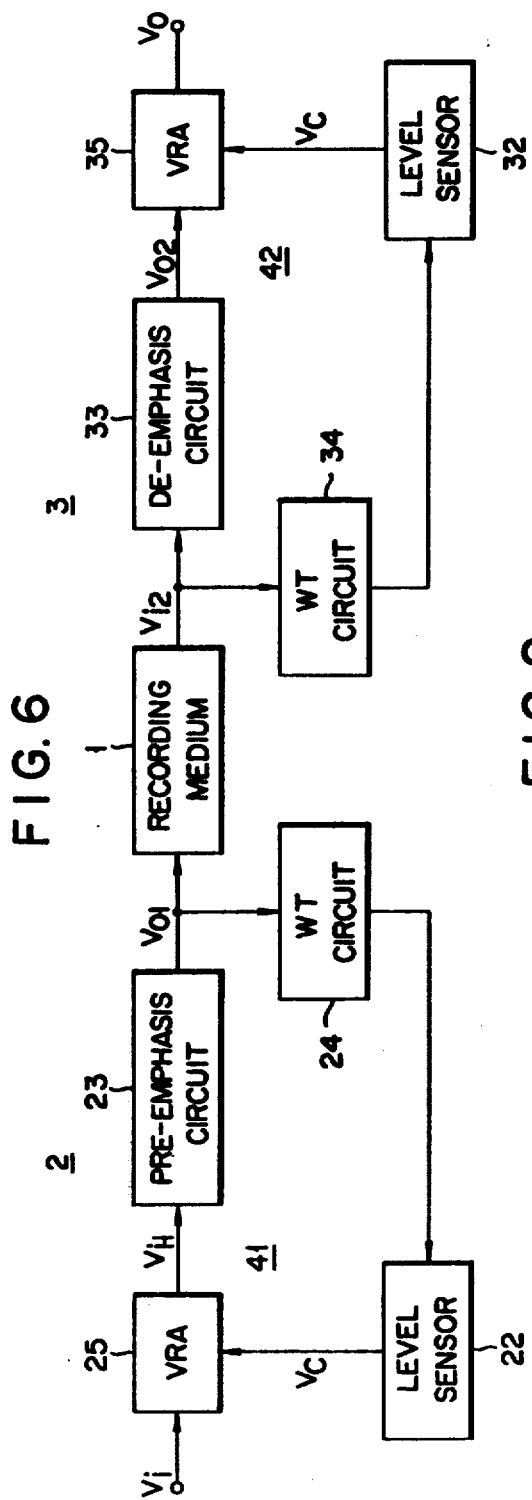
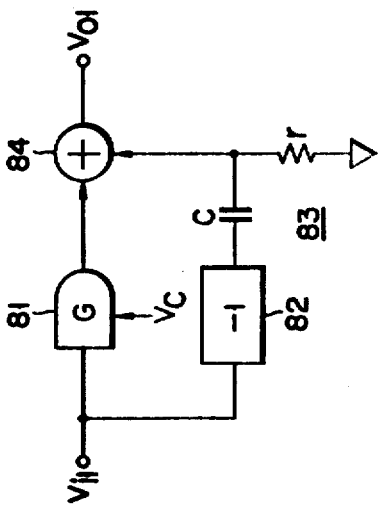

NOISE REDUCTION SYSTEM HAVING SPECIFIC ENCODER CIRCUITRY

BACKGROUND OF THE INVENTION

The invention relates to a system for reducing noise of recording mediums or transmission mediums and, more particularly, a noise reduction system suitable for reducing noise of sound signal recording/reproducing apparatuses such as tape-recorders.

In application of the noise reduction system to a transmission system treating the sound of high quality (including recording/reproducing system), so far as the S/N improvement of the system is not so good, the modulation of noise level is not noticeable. On the other hand, in the system with highly improved S/N, the noise level modulation is not negligible. Particularly, when it is applied to a transmission system with poor S/N, the noise level modulation is remarkable and it is practically problematic in some of sound sources.

This will be detailed by using a conventional noise reduction system with highly improved S/N with reference to FIGS. 1 and 2.

Referring now to FIG. 1, there is shown a conventional noise reduction system comprising an encoder 2 which is used in recording operation and serves as means for compressing the dynamic range of an analogue information signal, and a recording medium (or transmission medium) 1 such as tape-recorders connected at the input to the encoder 2, and a decoder 3 which is used in reproducing operation as means for expanding the compressed signal to the original dynamic range of the signal, being connected at the output of the recording medium 1.

A voltage controlled amplifier (VCA) 21 of the encoder 2 and a voltage controlled amplifier (VCA) 31 of the decoder 3 each serve as a kind of multiplier. When receiving an input signal $e_i$ and a DC level E, it produces an output signal $e_o$ expressed by:

$$e_o = E^{\pm 1} \times e_i \tag{1}$$

In the equation (1), the figure of E takes minus sign in encoding operation while it takes plus sign in decoding operation.

A level sensor 22 of the encoder 2 and another level sensor 32 of the decoder 3 are used to detect signal level and each of the sensors 22, 32 produces the DC level E corresponding to the level of the input signal e.

Thus, if the signal $e_{i1}$ is applied to the encoder 2, the encoder 2 produces an output signal (an input signal directed to the recording medium 1) $e_{o1}$ is given:

$$e_{o1} = E_{o1}^{-1} \times e_{i1} \tag{2}$$

For level expression of the signal in the equation (2), one can rewrite it to give:

$$E_{o1} = E_{o1}^{-1} \times E_{i1} \tag{3}$$

Therefore, we obtain:

$$E_{o1} = E_{i1}^{\frac{1}{2}} \tag{4}$$

This shows that level change of the signal in encoding is compressed to $\frac{1}{2}$ in the logarithmic scale.

When an output signal $e_{i2}$ is applied to the recording medium 1, the output signal $e_{o2}$ of the decoder 3 is given:

$$e_{o2} = E_{i2} \times e_{i2} \tag{5}$$

The level expression of the signal shown in the equation (5) is:

$$E_{o2} = E_{i2} \times E_{i2} \tag{6}$$

Hence:

$$E_{o2} = E_{i2}^2 \tag{7}$$

This means that the level change of the signal in decoding is expanded double in logarithmic scale.

FIG. 2 shows an operation characteristic of the abovementioned noise reduction system. The compression operation of the encoder 2 operating in recording operation traces a line A. For example, the +20 dB input signal is recorded with compression of +10 dB, thus improving the peak margin. Further, the −60 dB input signal is compressed to −30 dB. Thus, the input signal is recorded with the dynamic range thereof compressed half as a whole.

The expanding operation of the decoder 3 operating in the reproduction is defined by a curve B. The signal of +10 dB recorded in the recording medium 1 is expanded to the original +20 dB. The signal of −30 dB recorded is reduced to −60 dB, as shown in the figure. Note here that, at this time noise is also reduced by 30 dB. The −60 dB signal inputted to the encoder 2 is improved of its S/N by 30 dB.

Accordingly, the improvement of S/N of the noise reduction system is generally expressed by $-\frac{1}{2} \times$ (input signal level (dB)).

In this noise reduction system, in the input signal of −100 dB, its S/N improvement reaches 50 dB so that little noise is reproduced. On the other hand, the 0 dB input signal has the S/N improvement of 0 dB. In this manner, noise is modulated in accordance with change of the loudness of the sound source.

Generally, a great loudness of the sound source masks noise so that the noise modulation is not problematic. But in the sound with relatively simple harmonic such as piano solo, noise is insufficiently masked. In this case, the level of noise changes with rhythm of the sound source. When the noise level changes greatly, it more stimulates auditory sensation level than when noise with a fixed level appears.

One of the known schemes to remove such a defect is shown in FIG. 3. Briefly, the scheme employs a de-emphasis circuit 33 with the characteristic indicated by a curve B in FIG. 4. The de-emphasis circuit 33 is used to reduce the gain in the region including much noise of high-frequencies to forcibly suppress the noise itself. The use of the de-emphasis circuit, however, attenuates the musical sound in the high-frequency range. For this reason, it is necessary to use a pre-emphasis circuit 23 with characteristic indicated by a curve A and related in inverse-function to that of the de-emphasis circuit. The emphasis at high-frequencies when it is encoded, reduces the peak margin against the saturation level of the recording medium, thus possibly resulting in distortion of high-frequencies. Therefore, the sensitivity of the level sensor must be heightened at high-frequencies in order to more greatly compress it. For this, weighting circuits 24 and 34 with characteristic indicated by a curve C in FIG. 4, are used.

In the case of recording medium with high noise level, low saturation level and narrow band width, such as small size cassette tapes, the application of this scheme to it is not advisable. Particularly, in the sound source with simple spectrum construction, the noise modulation is remarkable and further when the spectrum envelope is high level overall the frequency range, the signal at high-frequencies is not reproduced due to saturation in the high-frequency range so that the reproduced sound is not clear with poor spacial distribution of sound. FIG. 5 shows a recording/reproducing frequency characteristic of one cassette tape recorder. This indicates that the characteristic at high-frequencies more deteriorates as the level of signal is higher. In other words, when musical sound, even if it is not encoded, is recorded at high level, its sound quality is deteriorated due to the fact that the high-frequency range is not reproduced. When encoded signal of which the high-frequency range is emphasized is recorded, this deterioration of the sound quality is more remarkable.

SUMMARY OF THE INVENTION

Accordingly, the primary object of the invention is to provide a noise reduction system with a simple construction which may be stably operable without deteriorating of sound quality, even when it is used in compact cassette tape-recorders.

According to the invention, there is provided a noise reduction system having an encoder for compressing the dynamic range of an input signal in accordance with the amplitude thereof and for delivering the compressed one to a signal transmission medium, and a decoder for expanding the dynamic range of an output signal of a signal transmission medium in accordance with the amplitude thereof, the noise reduction system comprising: a first controlled amplifier circuit provided in the encoder in which, when the input signal is in the low- and middle-level, the high-frequency range of the signal is sufficiently emphasized and, when the signal is high, the emphasis quantity in the high-frequency range is restrictive; and a second controlled amplifier circuit provided in the decoder and having a transfer function related to that of the first controlled amplifier circuit substantially in inverse-function manner, the first controlled amplifier having a variable response amplifier including a first resistor connected at one end to an input terminal, a current amplifier with variable gain amplifying current extracted from the other end of the first resistor, a series circuit including a capacitor and a second resistor and connected at one end to the input terminal, and means for adding an output current of the other end of the series circuit with an output current of the current amplifier and means for converting the summed current into voltage directed to an output terminal.

Other objects and features of the invention will be apparent from the following description taken in connection with accompanying drawings, in which:

BRIEF DESCRIPTION OF THE DRAWINGS

FIG. 6 shows a block diagram of a whole noise reduction system according to the present invention;

FIG. 9 shows one form of variable response amplifiers available for the encoder in FIG. 6;

DETAILED DESCRIPTION OF THE PREFERRED EMBODIMENTS

Figure 1:
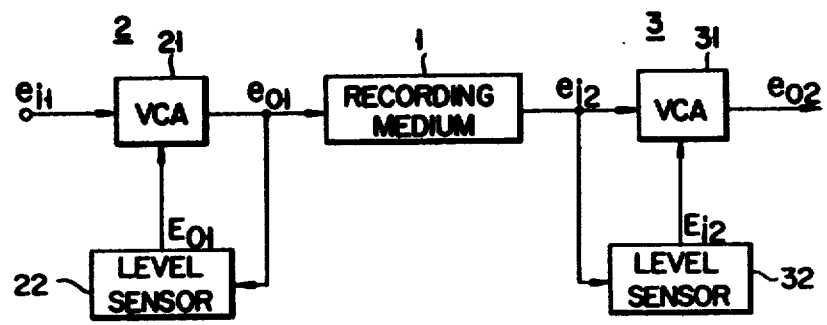
FIG. 1 shows a block diagram of a conventional noise reduction system.
Figure 2:
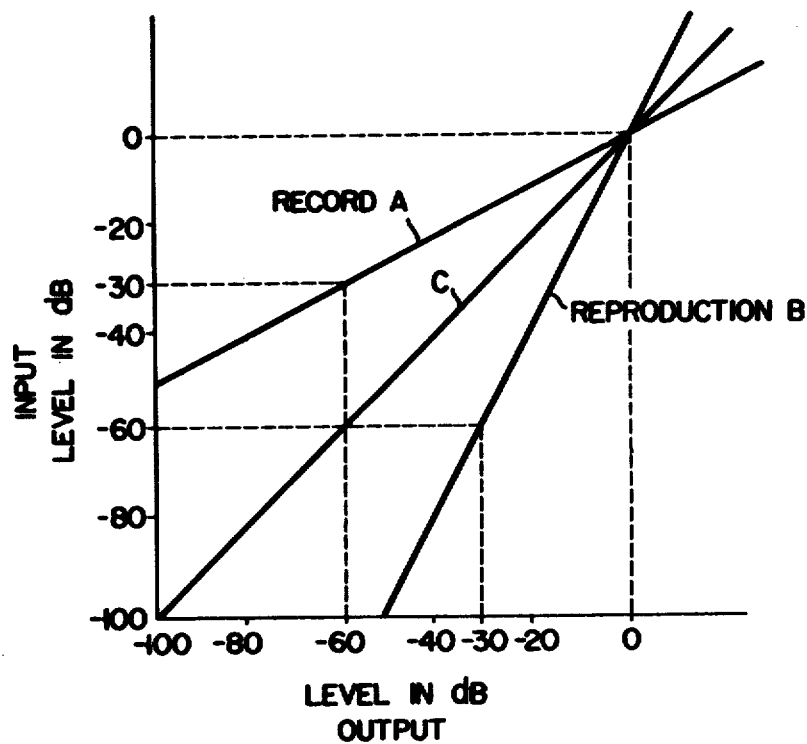
FIG. 2 shows operational characteristic curves of the noise reduction system shown in FIG. 1.
Figure 3:
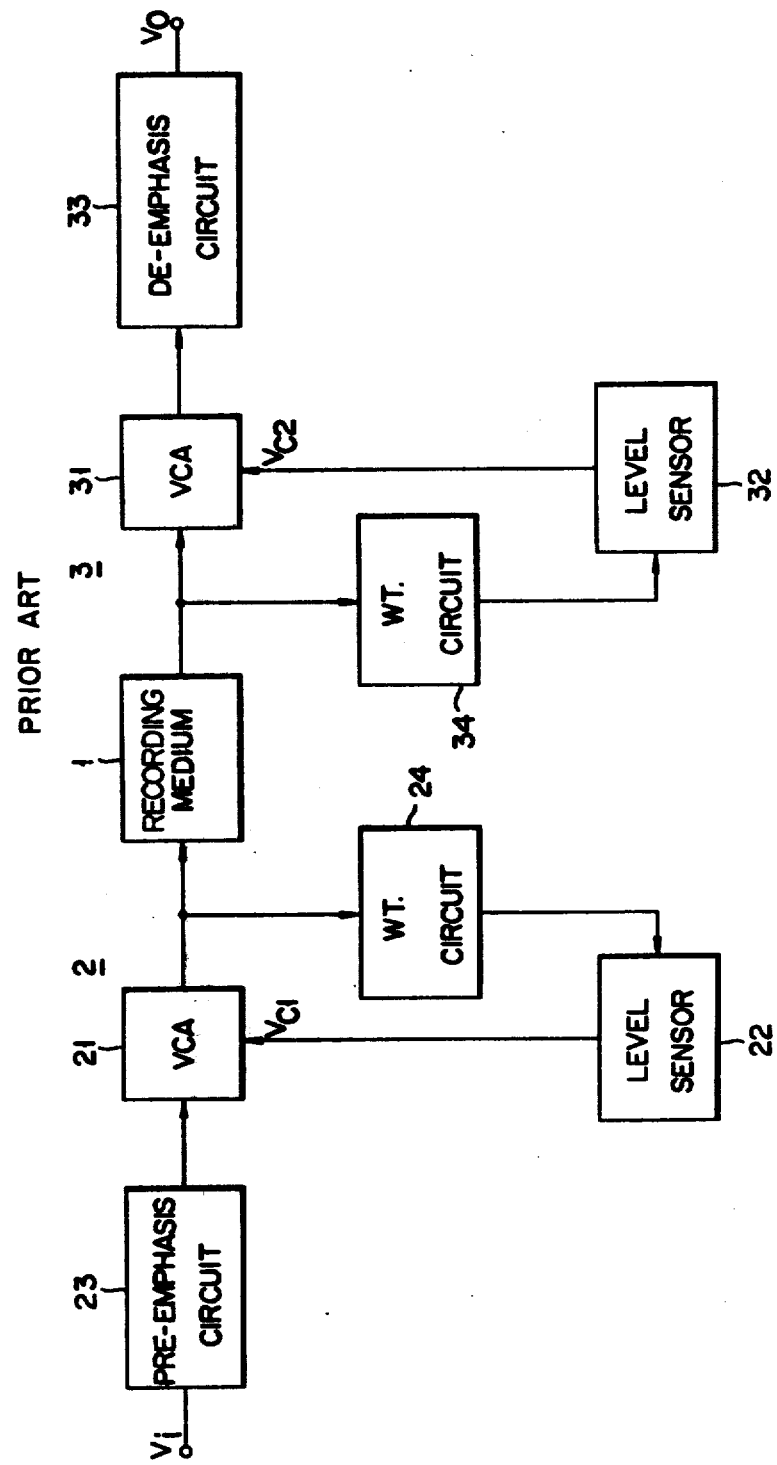
FIG. 3 shows a block diagram of another improved conventional noise reduction system.
Figure 4:
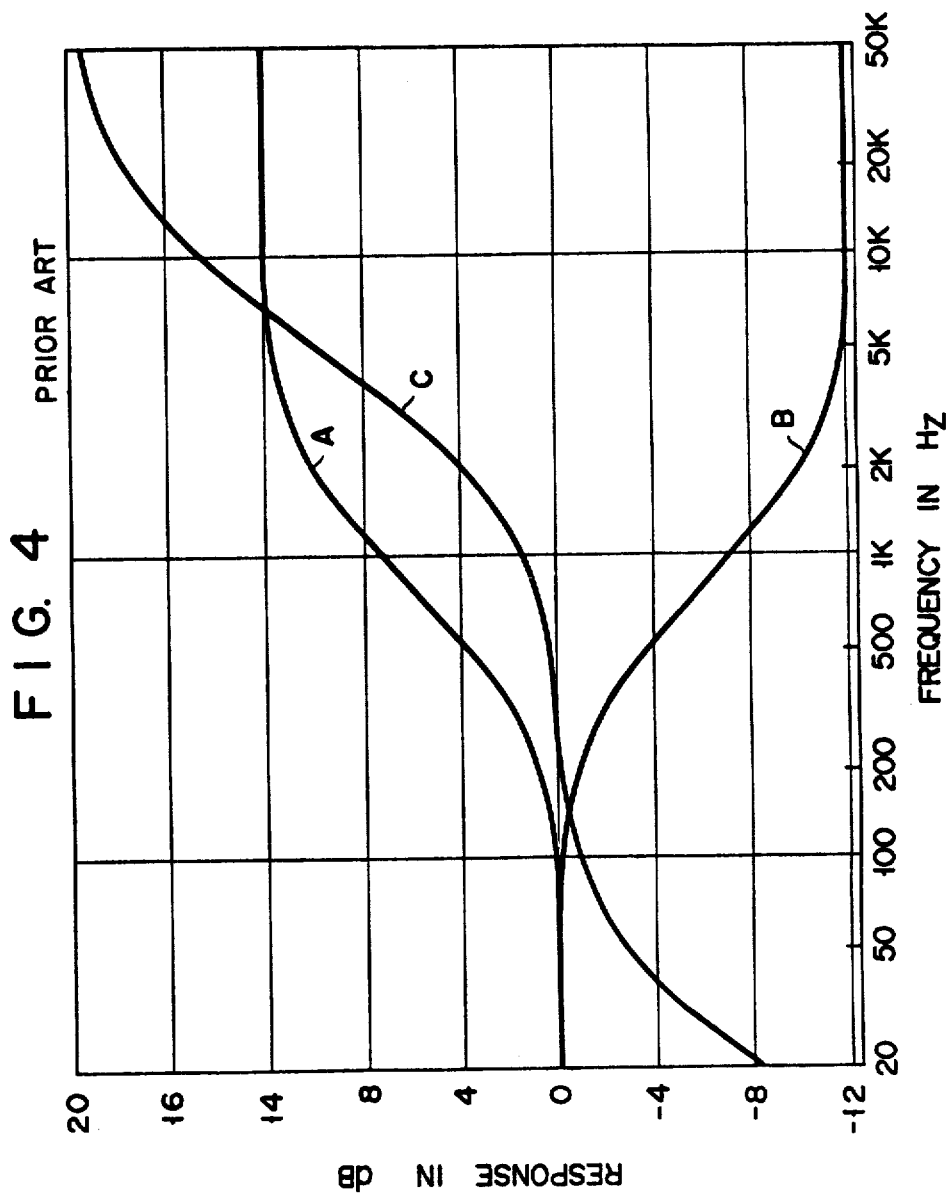
FIG. 4 shows characteristic curves illustrating the operations of respective portions of the noise reduction system shown in FIG. 3.
Figure 5:
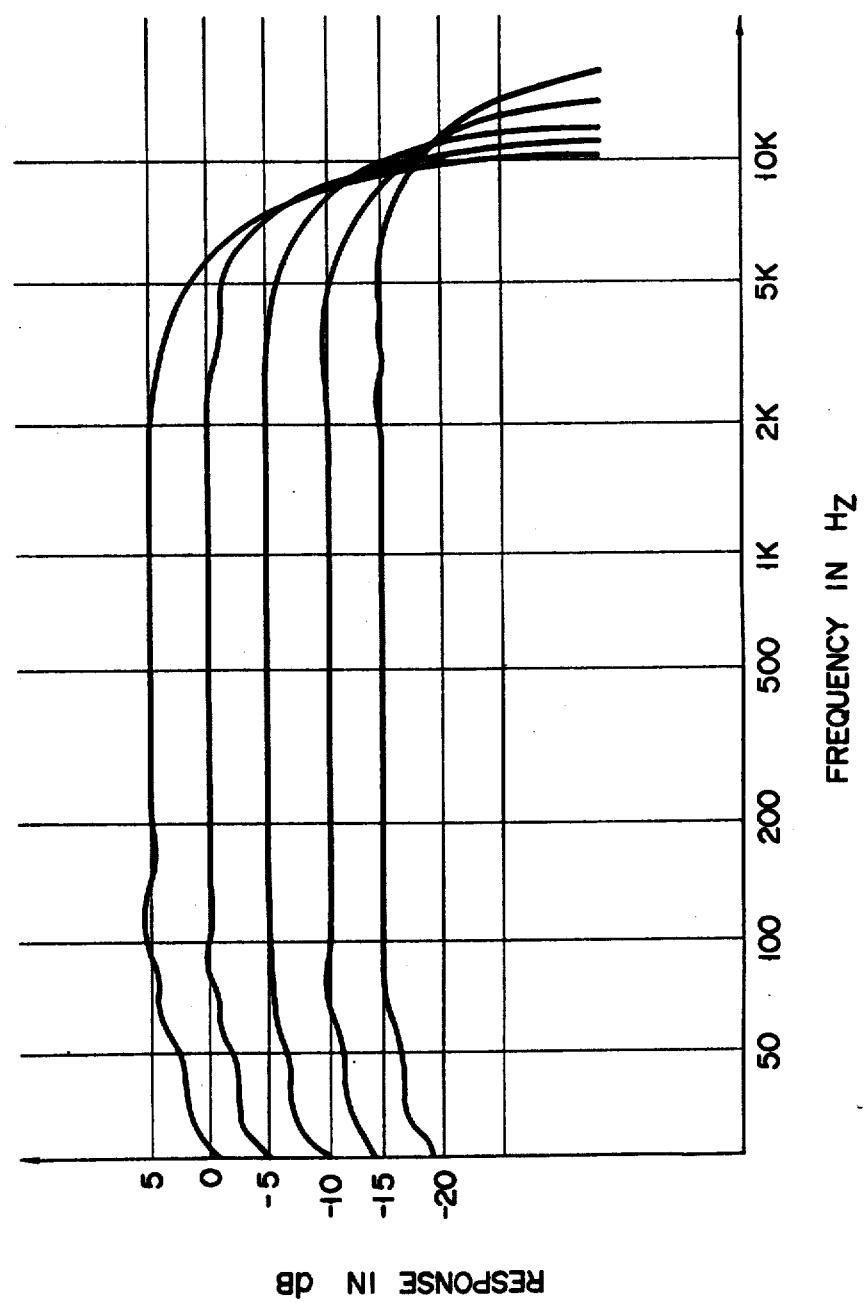
FIG. 5 shows one of recording/reproducing frequency characteristics of cassette tape-recorders generally used.
Figure 7:
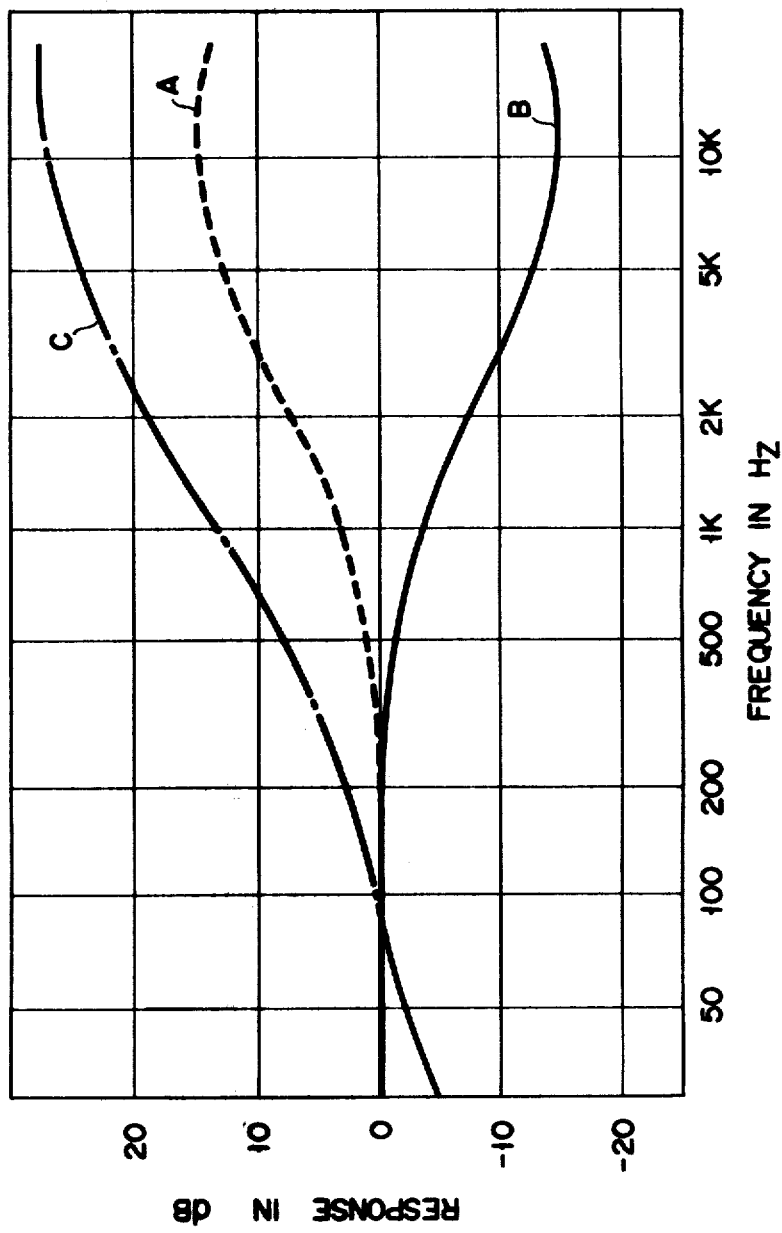
FIG. 7 shows characteristic curves illustrating the operations of the respective portions of the noise reduction system shown in FIG. 6.

Referring now to FIG. 6, there is shown a noise reduction system according to the invention. In the figure, the basic constructions of level sensors 22 and 32, a high-frequency pre-emphasis circuit 23, a high-frequency de-emphasis circuit 33, weighting circuits 24 and 34, and a recording medium (or a transmission medium) 1 are the same as those in FIG. 3. But the frequency-response characteristics of the encoder 2, decoder 3 and the weighting circuits 24, 34 are slightly different from those of circuits shown in FIG. 3 and are shown in FIG. 7. The output signals of the level sensors 22 and 32 are applied to the variable response amplifiers 25 and 35, respectively, to control simultaneously characteristics of gain and frequency.

Figure 8:
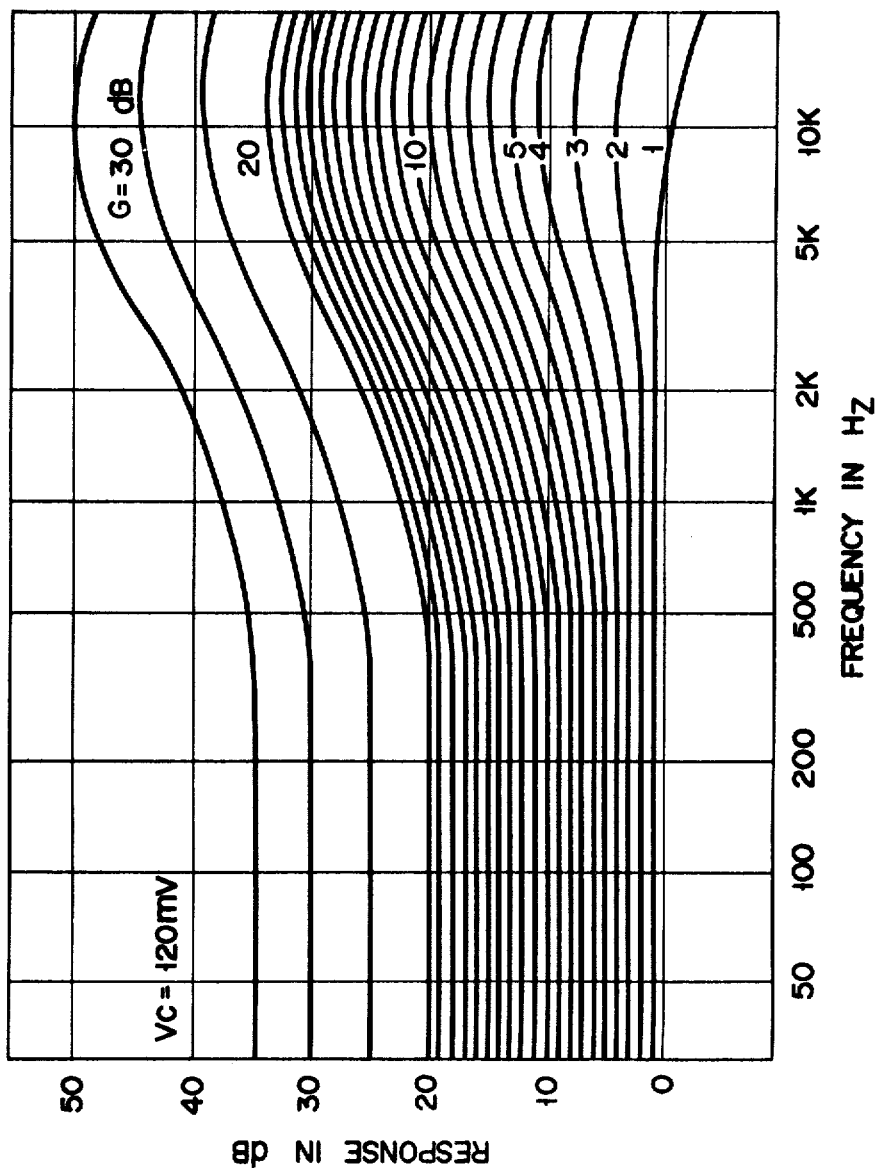
FIG. 8 shows a graph of the frequency-response characteristic curves of the controlled amplifier of encoder shown in FIG. 6.

FIG. 8 shows an overall frequency characteristic of the controlled amplifier of the encoder 2 including the high-frequency pre-emphasis circuit 23 and the variable response amplifier 25. As seen from the graph, when gain G of a voltage controlled amplifier (VCA) of the variable response amplifier 25 becomes small (the control voltage $V_c$ is at low potential), the gain overall the frequency range is reduced. In this case, the gain at high-frequencies considerably reduces as compared to that at other frequencies so that the amount of the emphasis at high-frequencies is small. On the other hand, when the gain G of the VCA becomes large (the control voltage $V_c$ is at high potential), the gain over all the frequency range increases and the gain at high-frequency range considerably increases as compared with of other frequency range and the amount of emphasis get large. The variable response amplifier 35 in the decoder 3 has a transfer function which is substantially an inverse function of that of the variable response amplifier 25 in the encoder 2.

The circuit construction shown in FIG. 6 uses the level sensors each operable in such a manner that, when the input level is high, it produces low voltage and vice versa. With such a construction, an input signal $V_i$ is applied to the encoder 2 and when its level is low, it is amplified by the controlled amplifier 41 consisting of the variable response amplifier 25 and the pre-emphasis circuit 23, and the high-frequency range of it is emphasized. This signal passes through the transmission medium 1 where noise is incorporated. The signal with the noise is then transferred to the decoder 3 of which the transfer function is substantially an inverse-function of that of the encoder 2. In the decoder 3, the controlled amplifier 42 having the variable response amplifier 35 and the de-emphasis circuit 33 reduces the level of the signal, particularly de-emphasizing it in the high-frequency range. This is followed by reduction of noise level, as in the conventional case. It is to be noted, however, that, if the emphasis quantity is sufficiently large at high-frequencies, the degree of the noise compression is large and thus the noise modulation is suppressed not to reach the auditory sensation level.

When the input level is high, it is attenuated by the controlled amplifier 41 to enlarge the peak margin, as in the conventional case. Note here that de-emphasizing of high-frequency range further enlarges the peak margin at high-frequencies and can reduce a modulation noise caused by, for example, vibration of a summing magnetic tape. As a matter of course, the pre-emphasized signal by reduced emphasizing characteristic at high-frequencies is compensated when it is decoded.

It will be understood that the controlled amplifier 41 of the encoder 2 is not limited in characteristic to that shown in FIG. 8. It may be satisfied with a characteristic that, when the gain is changed corresponding to change of the output $V_c$ of the level sensor, the emphasis quantity at high-frequencies when the gain is small is less than when it is large.

The explanation to follow is the details of the noise reduction system mentioned above. FIG. 9 shows an example of the variable response amplifier 25 used in the encoder 2, including a voltage controlled amplifier (hereinafter referred to as VCA) 81, an inversion amplifier 82, and a high-pass filter 83. The VCA 81 is such an amplifier that its gain G changes depending on the control voltage $V_c$ with a flat frequency characteristic. An adder 84 adds the output of the VCA 81 to the output of the inversion amplifier 82 after passing through the high-pass filter 83. With designation G of gain of the VCA 81, a transfer function $H_e(\omega)$ between $V_{i1}$ and $V_{o1}$ is:

$$H_e(\omega) = \frac{V_{o1}}{V_{i1}} = G - \frac{S_{cr}}{1 + S_{cr}} \quad (8)$$

$S = j\omega$ where
- $\omega$: angular frequency
- c: capacitance value of high-pass filter 83
- r: resistance value of high-pass filter 83

Figure 10:
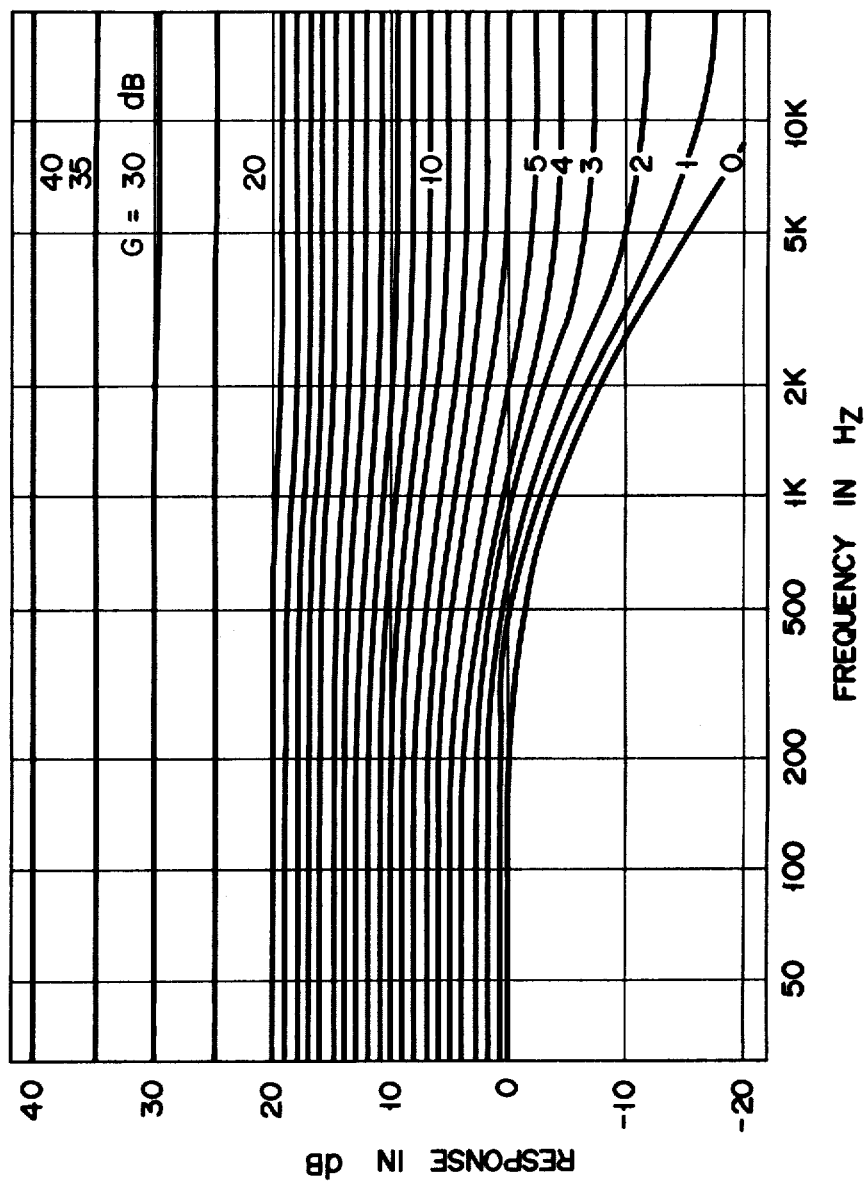
FIG. 10 shows the frequency-response characteristic of the variable response amplifier shown in FIG. 9.

The frequency-response characteristic of the variable response amplifier 25 within the range $G \geq 1$ is shown in FIG. 10. Therefore, if the variable response amplifier 25 and the high-frequency pre-emphasis circuit 23 with the characteristic indicated by a curve A in FIG. 7 are connected in series, the characteristics as shown in FIG. 8 can be obtained.

Figure 11:
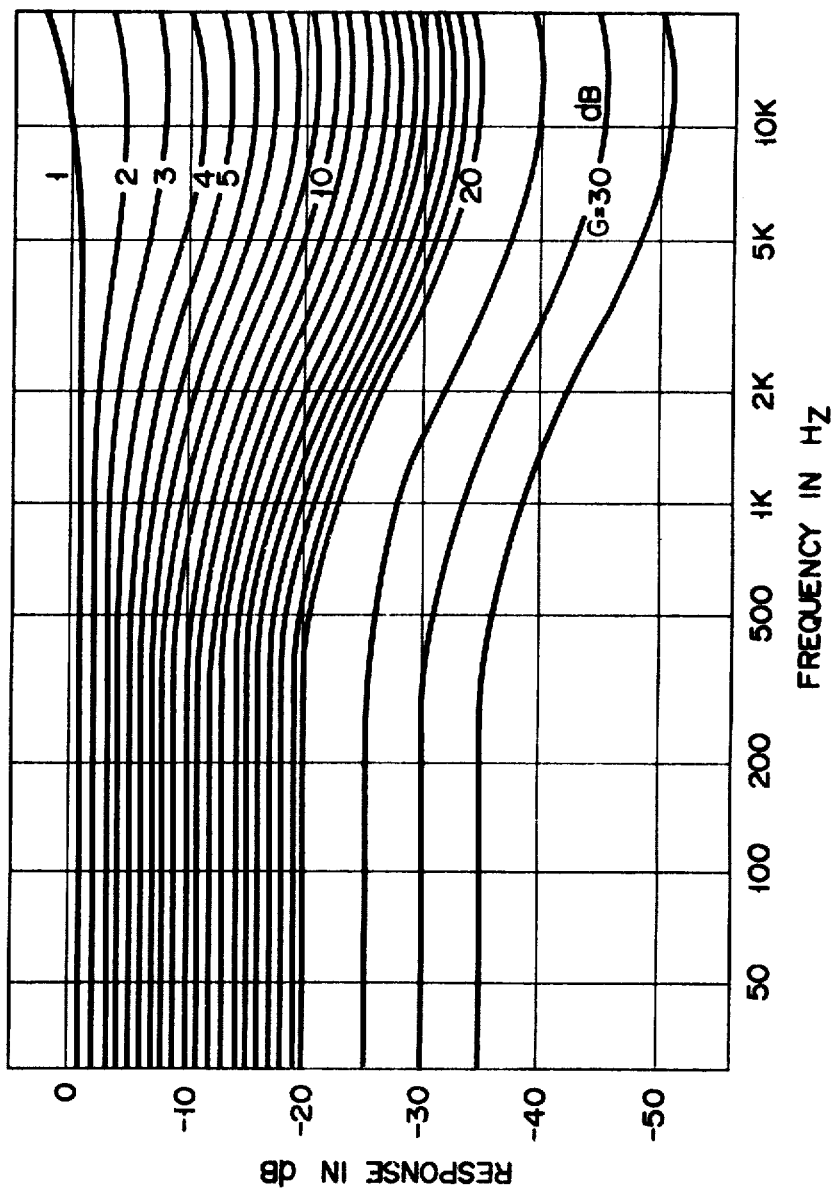
FIG. 11 shows a frequency-response characteristic of the controlled amplifier of the decoder shown in FIG. 6.
Figure 12:
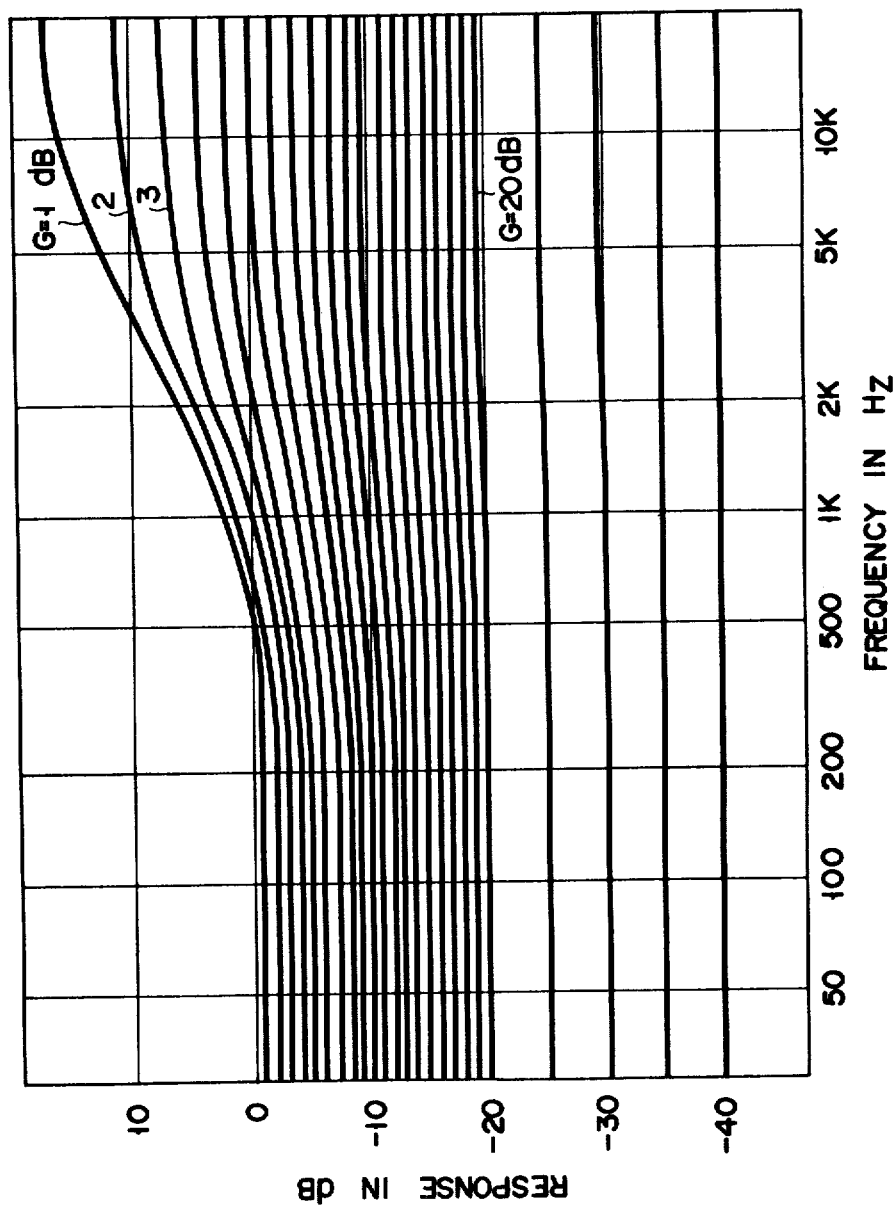
FIG. 12 shows a frequency-response characteristic of a variable response amplifier used in the decoder.

The overall frequency-response characteristic of the controlled amplifier 42 in the decoder 3 may be one which are in contrast with those of the encoder 2 as shown in FIG. 8. The overall frequency-response characteristic of the controlled amplifier is shown in FIG. 11. This is realized by using the variable response amplifier 35 with a transfer function $H_d(\omega)$ which is a reciprocal of the equation (8). FIG. 12 shows the frequency-response characteristics of the thus constructed variable response amplifier 35 within the range of $G \geq 1$.

The input and output signals of the variable response amplifier 25 shown in FIG. 9 are expressed in terms of voltage. That is, the input impedance of each block is infinite while the output impedance thereof is 0. Accordingly, if the VCA 81 is constructed by a current amplifier of the type to control signal current by the control voltage $V_c$, it is necessary to use a circuit (comprised of an operation amplifier) to convert the output current into voltage. The circuit shown in FIG. 9 further needs other operational amplifiers for use as the inversion amplifier 82 and the adder 84. This results in complexity of the variable response amplifier 25.

Figure 13A:
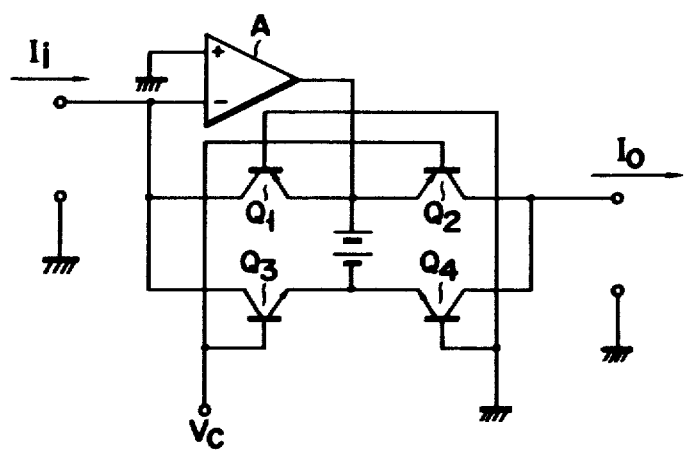
FIG. 13A shows a circuit diagram of an example of a voltage controlled amplifier (VCA) of the type to control signal current by control voltage.
Figure 13B:
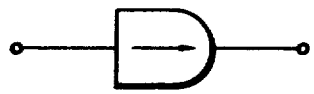
FIG. 13B shows a symbol indicating the circuit shown in FIG. 13A.

In the invention directed to overcome such the defects, the variable response amplifier 25 of the encoder 2 is constructed to operate in current mode. An example shown in FIG. 13A is the VCA comprising a current amplifier of the type to control signal current. Such a VCA is well known from, for example, U.S. Pat. No. 3,714,462 and thus details of it will be omitted. In the circuit of FIG. 13A, if the characteristics of four transistors $Q_1$ to $Q_4$ are much the same, the input current $I_i$ and the output current $I_o$ are related in the following:

$$I_o = -I_i \times EXP((V_c + V_b)/V_T) \quad (9)$$

where
- $V_T = kT/q$
- $V_b$: bias voltage
- $V_c$: control voltage The VCA will be hereinafter represented by a symbol as shown in FIG. 13B.

Figure 14:
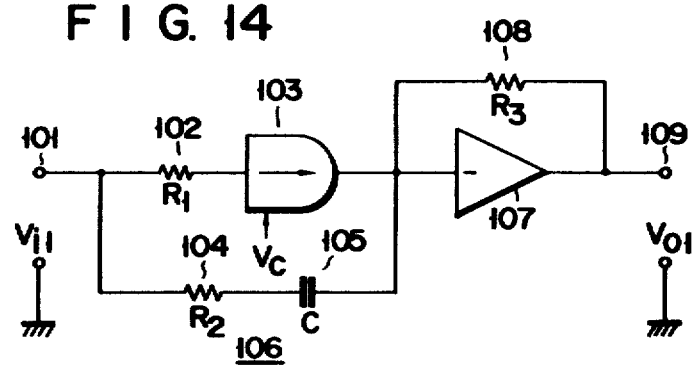
FIG. 14 shows a circuit diagram of the variable response amplifier in the encoder shown in FIG. 6 according to the present invention.

FIG. 14 shows a circuit diagram of the variable response amplifier 25 of one embodiment of this invention used in the encoder 2 and constructed by such a VCA. A reproduced analogue information signal voltage $V_{i1}$ to be applied to an input terminal 101 is converted by a first resistor 102 (of which the resistance is $R_1$) into current $I_1$ given by an equation (10) and then sent forth to the VCA 103.

$$I_1 = V_{i1}/R_1 \quad (10)$$

Therefore, at the output terminal of the VCA 103 there is obtained current $I_2$ shown in an equation (12). The current $I_2$ is a product of the current $I_1$ and gain $G_i$ (current amplification factor) to be controlled by a controlling voltage $V_c$.

$$G_i = -EXP((V_c + V_b)/V_T) \quad (11)$$

$$I_2 = I_1 G_i = -\frac{V_{i1}}{R_1} EXP((V_c + V_b)/V_T \quad (12)$$

On the other hand, the input voltage $V_{i1}$ is further converted by a series circuit 106 comprising a resistor 104 (of which the resistance is $R_2$) and a capacitor 105

(of which the capacitance is C) into current $I_3$ given by an equation (13).

$$I_3 = \frac{j\omega C V_{il}}{1 + j\omega C R_2} \quad (13)$$

The output terminals of the VCA 103 and series circuit 106 are commonly connected to an inversion input terminal of an operational amplifier 107. Since, all of the currents $I_2$, $I_3$ flow through a resistor 108 (of which resistance is $R_3$) provided in a negative feedback loop of the operational amplifier 107, an output voltage $V_{o1}$ represented by the following equation (14) can be obtained at an output terminal 109.

$$V_{o1} = -R_3(I_2 + I_3)$$

$$= R_3\left(\frac{EXP((V_c + V_b)/V_T)}{R_1} - \frac{j\omega C}{1 + j\omega C R_2}\right) \cdot V_{i1} \quad (14)$$

Thus, current obtained by summing $I_2$ and $I_3$ is converted into the voltage $V_{o1}$ by a circuit comprising the operational amplifier 107 and the resistor 108.

Accordingly, the relation between the input and output voltages $V_{i1}$ and $V_{o1}$, namely, the transfer function $H_e(\omega)$ of the variable response amplifier 25 shown in FIG. 14 becomes as follows:

$$\frac{V_{o1}}{V_{i1}} = H_e(\omega)$$

$$= R_3\left(\frac{EXP((V_c + V_b)/V_T)}{R_1} - \frac{j\omega C}{1 + j\omega C R_2}\right) \quad (15)$$

Providing that:

$$\frac{R_3}{R_1} EXP((V_c + V_b)/V_T) = G \quad (16)$$

and $$R_2 = R_3 = r \quad (17)$$

the equation (15) can be rewritten in the similar manner as the equation (8). Thus, since the substitution of the equation (16) into the equation (15) does not lose the generality of the equation (15) and the substitution of the equations (16), (17) into the equation (15) means that a constant is multiplied with the equation (15), the equation (15) is equivalent to the equation (8). Therefore, the variable response amplifier 25 shown in FIG. 14 represents a characteristic as shown in FIG. 10.

The circuit shown in FIG. 14 is so constructed that output currents of the VCA 103 and the series circuit 106 including the resistor 104 and the capacitor 105 are summed in the form of current by the circuit stage of the operational amplifier 107 and the resistor 108 and the summed current is converted by the stage, wherein the circuit shown in FIG. 14 has a characteristic as shown in FIG. 10 and can be used as the VRA 25 used in the encoder 2. Thus, the number of operational amplifiers is considerably reduced as compared with those of the FIG. 9, resulting in simplification of the circuit construction.

The current-voltage converting circuit shown in FIG. 14 only has the resistor 108 connected across the operational amplifier 107 and the frequency-response characteristic of the resistor 108 is constant. But a current-voltage converting circuit having a non-linear frequency-response characteristic may be used. The circuit shown in FIG. 15 shows one example of a current-voltage converting circuit with a non-linear frequency-response characteristic.

Figure 15:
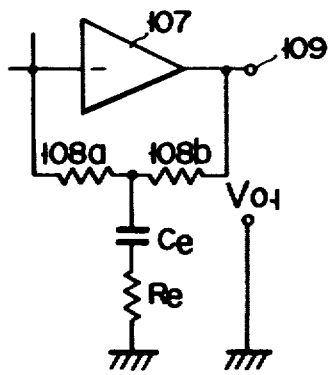
FIG. 15 shows another example of the current-voltage converting circuit shown in FIG. 14.

The circuit shown in FIG. 15 is a T-type four-terminal circuit having a first series circuit consisting of resistors 108a, 108b connected between the input and output terminals of the operational amplifier 107 and a second series circuit of a capacitor $C_e$ and a resistor $R_e$ having one end connected to the junction of the resistors 108a, 108b and the other end connected to the ground. Due to the presence of the capacitor $C_e$, the voltage $V_{o1}$ at the output terminal 109 becomes high in the high-frequency range of the voltage $V_{o1}$.

As described above, there is eliminated deterioration of sound quality when the noise reduction system of the invention is applied to compact cassette tape-recorder, along with ensuring stability of operation and cost reduction of its being simplicity of circuit construction.

Various other modifications of the disclosed embodiments will be apparent to person skilled in the art without departing from the spirit and scope of the invention as defined by the appended claims.

What we claim is:

1. A noise reduction system having an encoder for compressing the dynamic range of an audio input signal in accordance with the amplitude thereof and for delivering the compressed audio signal to a signal transmission medium, and a decoder for expanding the dynamic range of an audio signal reproduced from the signal transmission medium in accordance with the amplitude thereof, said noise reduction system comprising: a first controlled amplifier circuit provided in the encoder in which, when the input signal is in the low- and middle-level, the high-frequency range of the signal is sufficiently emphasized and, when the signal is high, the emphasis quantity in the high-frequency range is restrictive; and a second controlled amplifier circuit provided in the decoder and having a transfer function related to that of said first controlled amplifier circuit substantially in inverse-function manner; said first controlled amplifier circuit including a first variable response amplifier having a first resistor connected at one end to the input terminal of the encoder, a current amplifier with variable gain for amplifying current extracted from the other end of said first resistor, a series circuit having a second resistor and a capacitor and connected at one end to the input terminal of the encoder, and means for adding the output current of the other end of the series circuit with the output current of the current amplifier and means for converting the summed current into voltage directed to the output terminal of the encoder.

2. A noise reduction system according to claim 1, in which said encoder comprises a weighting circuit for providing a predetermined amount of weight to the output of the first controlled amplifier, a level sensor for detecting the output level of the weighting circuit so as to generate a corresponding controlling voltage, and means for supplying the output controlling voltage from the level sensor to the controlling voltage input terminal of the first controlled amplifier circuit.

3. A noise reduction system according to claim 1, in which said first controlled amplifier circuit comprises a high-frequency pre-emphasis circuit, for emphasizing high-frequency signal level of the audio signal.

4. A noise reduction system according to claim 1, in which said current/voltage converting means comprises an operational amplifier having input terminals receiving an output current from the other end of said series circuit and an output current of said current amplifier, and a negative feedback network including at least one impedance element and connected between the input and output terminals of the operational amplifier.

5. A noise reduction system according to claim 4, in which said impedance element is a resistor.

6. A noise reduction system according to claim 4, in which said feedback network has a frequency characteristic.

7. A noise reduction system according to claim 1, in which said decoder comprises a weighting circuit having an input terminal connected to the input terminal of the second controlled amplifier for providing a predetermined amount of weight to the input of the second controlled amplifier circuit, a level sensor for detecting the output level of the decoder weighting circuit so as to generate a corresponding controlling voltage, and means for supplying the output controlling voltage from the decoder level sensor to the controlling voltage input terminal of the second controlled amplifier circuit.

8. A noise reduction system according to claim 1, in which said second controlled amplifier circuit comprises a high-frequency de-emphasis circuit for attenuating the level of the high-frequency component of the output signal of said signal transmission medium.

* * * * *